(12) United States Patent
Lung

(10) Patent No.: US 7,910,907 B2
(45) Date of Patent: Mar. 22, 2011

(54) MANUFACTURING METHOD FOR PIPE-SHAPED ELECTRODE PHASE CHANGE MEMORY

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 598 days.

(21) Appl. No.: 11/375,816

(22) Filed: Mar. 15, 2006

(65) Prior Publication Data

US 2007/0215852 A1    Sep. 20, 2007

(51) Int. Cl.
*H01L 21/00* (2006.01)
(52) U.S. Cl. ............ 257/4; 257/3; 257/5; 257/529; 257/530; 257/E27.004; 257/E45.001; 257/E45.002; 438/95; 438/128; 438/130; 438/381
(58) Field of Classification Search ............ 257/1, 2–5, 257/52, 154, 296, 300, 529–530, E31.029, 257/E29.088, E27.004, E45.001, E45.002, 257/614; 438/238, 95, 102, 128, 130, 257–258, 438/381–385, 618, 900
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

WO    WO 00/45108 A1    8/2000
(Continued)

OTHER PUBLICATIONS

Adler, David, "Amorphous-Semiconductor Devices," Sci. Amer., vol. 236, pp. 36-48, May 1977.

(Continued)

*Primary Examiner* — A. Sefer
*Assistant Examiner* — Ermias Woldegeorgis
(74) *Attorney, Agent, or Firm* — Haynes Beffel & Wolfeld LLP

(57) ABSTRACT

A method for manufacturing a memory cell device includes forming a bottom electrode comprising a pipe-shaped member, a top, a bottom and sidewalls having thickness in a dimension orthogonal to the axis of the pipe-shaped member, and having a ring-shaped top surface. A disc shaped member is formed on the bottom of the pipe-shaped member having a thickness in a dimension coaxial with the pipe-shaped member that is not dependent on the thickness of the sidewalls of the pipe-shaped member. A layer of phase change material is deposited in contact with the top surface of the pipe-shaped member. A top electrode in contact with the layer of programmable resistive material. An integrated circuit including an array of such memory cells is described.

22 Claims, 8 Drawing Sheets

U.S. PATENT DOCUMENTS

| | | | |
|---|---|---|---|
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 * | 8/2002 | Harshfield | 438/618 |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 * | 9/2003 | Lowrey et al. | 438/95 |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 * | 9/2004 | Johnson et al. | 257/3 |
| 6,797,979 B2 | 9/2004 | Chiang et al. | |
| 6,805,563 B2 | 10/2004 | Ohashi | |
| 6,815,704 B1 | 11/2004 | Chen | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 * | 4/2005 | Lai | 438/95 |
| 6,888,750 B2 | 5/2005 | Walker et al. | |
| 6,894,305 B2 | 5/2005 | Yi et al. | |
| 6,897,467 B2 | 5/2005 | Doan et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,943,365 B2 * | 9/2005 | Lowrey et al. | 257/3 |
| 6,992,932 B2 | 1/2006 | Cohen | |
| 7,023,009 B2 | 4/2006 | Kostylev et al. | |
| 7,485,891 B2 | 2/2009 | Hamann et al. | |
| 2002/0017701 A1 * | 2/2002 | Klersy et al. | 257/536 |
| 2002/0079483 A1 * | 6/2002 | Dennison | 257/5 |
| 2004/0113232 A1 * | 6/2004 | Johnson et al. | 257/529 |
| 2004/0248339 A1 | 12/2004 | Lung | |
| 2005/0127347 A1 | 6/2005 | Choi et al. | |
| 2005/0127349 A1 | 6/2005 | Horak et al. | |
| 2005/0215009 A1 | 9/2005 | Cho | |
| 2006/0110888 A1 * | 5/2006 | Cho et al. | 438/385 |
| 2007/0045606 A1 | 3/2007 | Magistretti et al. | |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

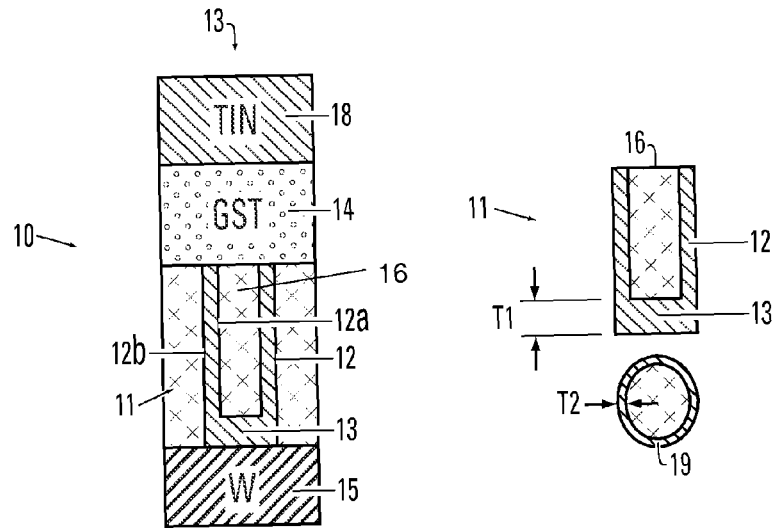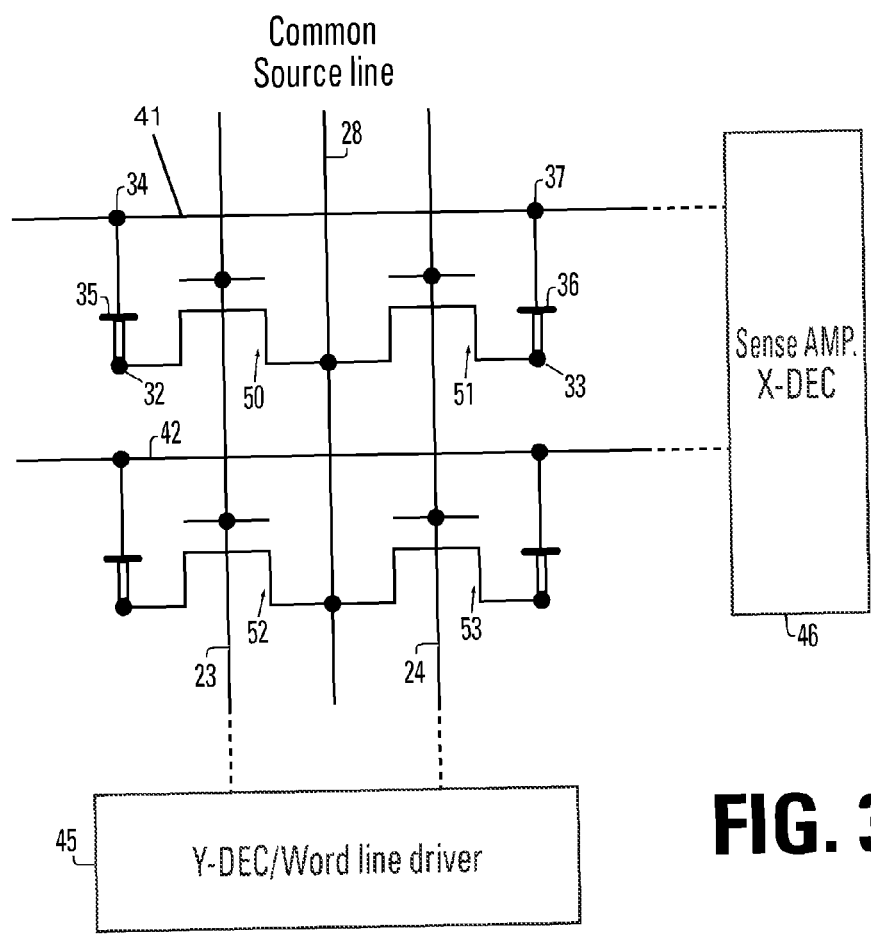

MANUFACTURING METHOD FOR PIPE-SHAPED ELECTRODE PHASE CHANGE MEMORY

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive material, like phase change based memory materials, and to methods for manufacturing such devices.

2. Description of Related Art

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

SUMMARY OF THE INVENTION

The present invention includes devices and methods to form memory cell devices including a small contact area between a bottom electrode and a layer of programmable resistive material, such as phase change material. A method for manufacturing a memory cell device includes forming a bottom electrode comprising a pipe-shaped member, a first end (hereinafter the bottom), a second end (hereinafter the top) and sidewalls having thickness in a dimension orthogonal to the axis of the pipe-shaped member, and having a ring-shaped surface at the top. A disc shaped member is formed on the bottom of the pipe-shaped member having a thickness in a dimension coaxial with the pipe-shaped member that is not dependent on the thickness of the sidewalls of the pipe-shaped member. In addition, the material of the disc shaped member is different that the material of the pipe-shaped member in embodiments described herein. A layer of phase change material is deposited in contact with the ring-shaped surface of the pipe-shaped member. A second electrode is formed in contact with the layer of phase change material.

In embodiments described herein, the first electrode is formed using a method comprising forming a layer of first electrode material, which is substantially planar, on a contact structure, forming a pillar preferably comprising a dielectric material or other low conductivity material on the layer of electrode material, depositing a conformal layer of a second electrode material over the pillar so that the pillar has sidewalls of electrode material contacting the layer of first electrode material, depositing a fill material and then etching or polishing the structure to a level intersecting the pillar below the top of the pillar, leaving a pipe-shaped member with a ring-shaped top surface comprising the second electrode material. The first electrode material is selected for stability of contact with the underlying material and adhesion to the second electrode material. The second electrode material is selected for resistivity, so that it can act as a heater for the phase change material, and for good adhesion to the phase change material. In some embodiments, the first and second electrode materials are the same. In one preferred embodiments, the first and second electrode materials are different materials.

A layer of programmable resistive material is deposited in contact with the ring-shaped surface of the pipe-shaped member.

An integrated circuit including a memory array is described comprising a plurality of such memory devices with access transistors, arranged in a high density array of rows and columns. The access transistors comprise source and drain regions in a semiconductor substrate, and a gate coupled to word lines along rows of memory cells. The memory cells are formed in a layer above the access transistors on the integrated circuit, with a bottom electrode contacting the drain of a corresponding access transistor. Bit lines are formed using a layer of metallization above the memory cells contacting the top electrodes on the memory devices along columns of memory cells in the array. In an embodiment described, two rows of memory cells share source contacts, with a common source line coupled to the source contact and extending generally parallel to the word lines through the array.

A reliable memory cell structure is provided with a low reset current, which is manufacturable using the standard lithographic and deposition processes. The cell structure is particularly suited to integration with CMOS circuitry on a large scale integrated circuit device.

Other aspects and advantages of the technology described herein can be understood with reference to the figures and the detailed description which follow.

BRIEF DESCRIPTION OF THE DRAWINGS

FIG. 1 is a cross-section via of an embodiment of a memory cell based on a pipe-shaped electrode coupled to a programmable resistive material.

FIGS. 2A and 2B are orthogonal cross-sections of an embodiment of a pipe-shaped member of conductive material.

FIG. 3 is a circuit schematic of a memory array including memory elements like those shown in FIG. 1.

DETAILED DESCRIPTION

Figure 4:
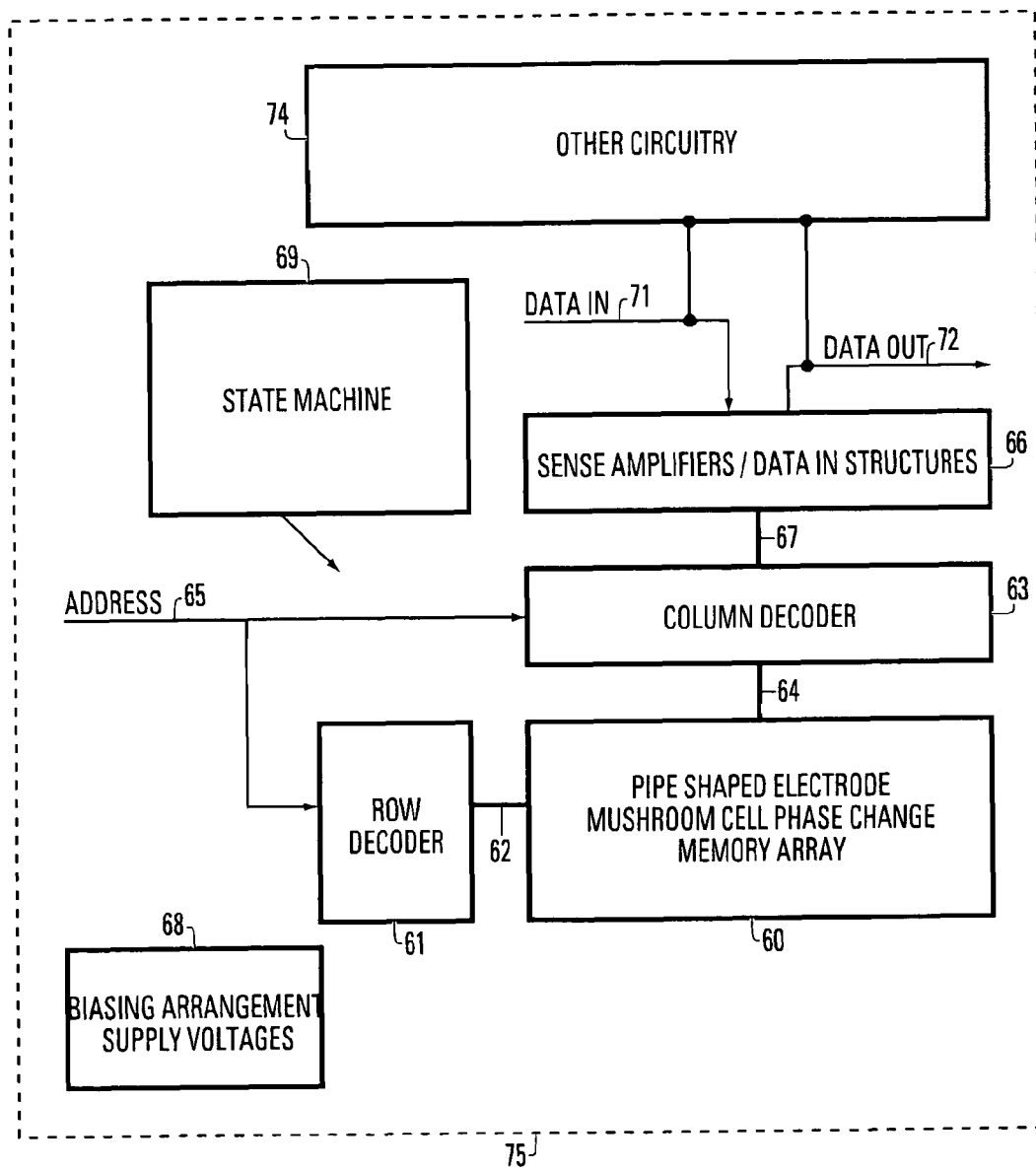
FIG. 4 is a block diagram of an integrated circuit device including a pipe-shaped electrode phase change memory array and other circuitry.

The following detailed description is made with reference to the figures. Preferred embodiments are described to illustrate the present invention, not to limit its scope, which is defined by the claims. Those of ordinary skill in the art will recognize a variety of equivalent variations on the description that follows.

FIG. 1 is a simplified cross-sectional view of a pipe-shaped electrode, phase change memory cell 10. The cell includes a bottom electrode 11 in contact with a terminal 15 of an access structure. The bottom electrode includes a pipe-shaped member 12 and a disc shaped member 13 at the bottom of the pipe-shaped member 12. The pipe-shaped member 12 and the disc shaped member 13 comprise electrode material, and preferably but not necessarily, the same material, such as TiN. A thermal insulator is inside the inside surface of the pipe-shaped member 12 in some embodiments. In the illustrated embodiment, the pipe-shaped member 12 is filled with an insulating material 16, which preferably has a low thermal conductivity. A layer 14 of programmable resistive memory material is formed in contact with the ring-shaped top surface of the pipe-shaped member 11. A top electrode 18 is formed in electrical communication with the layer 14 of programmable resistive memory material.

The pipe-shaped member 12 comprises sidewalls having an inside surface 12a and an outside surface 12b, which are cylinder-like. Thus, the inside and outside surfaces 12a, 12b can be understood as basically cylindrical surfaces, classically defined as surfaces traced by a line moving parallel to a fixed line and intersecting a fixed curve, where for a circular cylinder the fixed line lies at the center, or axis, of the pipe-shaped member and the fixed curve is a circle centered on the fixed line. The inside and outside surfaces 12a, 12b for this circular cylindrical shape would be defined by respective circles having radii that differ by the thickness of the wall of the pipe-shaped member, and thus define the inside and outside diameters of the pipe-shaped member. In embodiments of the pipe-shaped member, the cylinder-like shape has an outside perimeter that is circular, elliptical, rectangular or somewhat irregularly shaped, depending on the manufacturing technique applied to form the pipe-shaped member. The "ring-shaped" top surface described herein, is therefore not necessarily circular, but rather takes the shape of a cross-section of the pipe-shaped member.

FIGS. 2A and 2B show respective orthogonal cross-sections of the bottom electrode 11 of the cell 10 of FIG. 1. The bottom electrode 11 includes the pipe-shaped member 12, filled with material 16, and the disc shaped member 13. The area 19 represents the ring-shaped top surface of the pipe-shaped member 12. The thickness T1 of the disc shaped member 13 in a dimension parallel to the axis of the pipe-shaped member is significantly greater than the thickness T2 of the sidewalls of the pipe-shaped member 12 in a dimension orthogonal to the axis of the pipe-shaped member. Preferably, the thickness T1 is at least twice the thickness T2.

In the illustrated embodiment, the pipe-shaped member has a closed end at the bottom defined by the disc shaped member 13, and in electrical contact with a top surface of a contact 15. The fill 16 in the pipe-shaped cells may include silicon oxide, silicon oxynitride, silicon nitride, $Al_2O_3$, other low K (low permitivity) dielectrics, or an ONO or SONO multi-layer structure. Alternatively, the fill may comprise an electrical insulator including one or more elements selected from the group consisting of Si, Ti, Al, Ta, N, O, and C. In preferred devices, the fill has a low thermal conductivity, less than about 0.014 J/cm*K*sec. In other preferred embodiments, the thermal insulator has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers. Other examples of materials which are candidates for use for the thermally insulating cap layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within the pipe can provide thermal and electrical insulation.

In embodiments described herein, the pipe-shaped member consists of a thin film formed on the sides of a pillar formed on a layer of electrode material. Thus the walls of the pipe-shaped member can be very thin, as determined by the process used to deposit thin films conformally over pillars. Also, in embodiments described herein, the disc shaped member has a thickness that is not dependent on the thickness of the sidewalls of the pipe-shaped member. Rather, the disc shaped member is formed by different process, such as a substantially planar deposition over the contacts having a thickness that can be much greater than the thickness of the sidewalls, improving reliability of the contacts to the access circuitry, and improving structural integrity of the memory cells.

A memory cell 10 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the programmable resistive material comprises a phase change material, such as $Ge_2Sb_2Te_5$ or other materials described below. The region in the cell 10 that changes phase is small; and accordingly, the magnitude of the reset current required for changing the phase is very small.

Embodiments of the memory cell include phase change based memory materials, including chalcogenide based materials and other materials, for the layer 14 of phase change material. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8.% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

In following sections of the disclosure, the phase change material is referred to as GST, and it will be understood that other types of phase change materials can be used. A material useful for implementation of a memory cell as described herein is $Ge_2Sb_2Te_5$.

Useful characteristics of the programmable resistive material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. Alternatively, it may be one of the other phase change materials identified above.

FIG. 3 is a schematic illustration of a memory array, which can be implemented as described herein. In the schematic illustration of FIG. 3, a common source line 28, a word line 23 and a word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and a set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the bottom electrode member 32 for pipe-shaped electrode memory cell 35, which has top electrode member 34. The top electrode member 34 is coupled to the bit line 41. Likewise, the drain of access transistor 51 is coupled to the bottom electrode member 33 for pipe-shaped electrode memory cell 36, which has top electrode member 37. The top electrode member 37 is coupled to the bit line 41. Access transistors 52 and 53 are coupled to corresponding pipe-shaped electrode memory cells as well on bit line 42. It can be seen that the common source line 28 is shared by two rows of memory cells, where a row is arranged in the Y-direction in the illustrated schematic. In other embodiments, the access transistors can be replaced by diodes, or other structures for controlling current flow to selected devices in the array for reading and writing data.

FIG. 4 is a simplified block diagram of an integrated circuit according to an embodiment of the present invention. The integrated circuit 74 includes a memory array 60 implemented using pipe-shaped electrode phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the side wall pin memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 5:
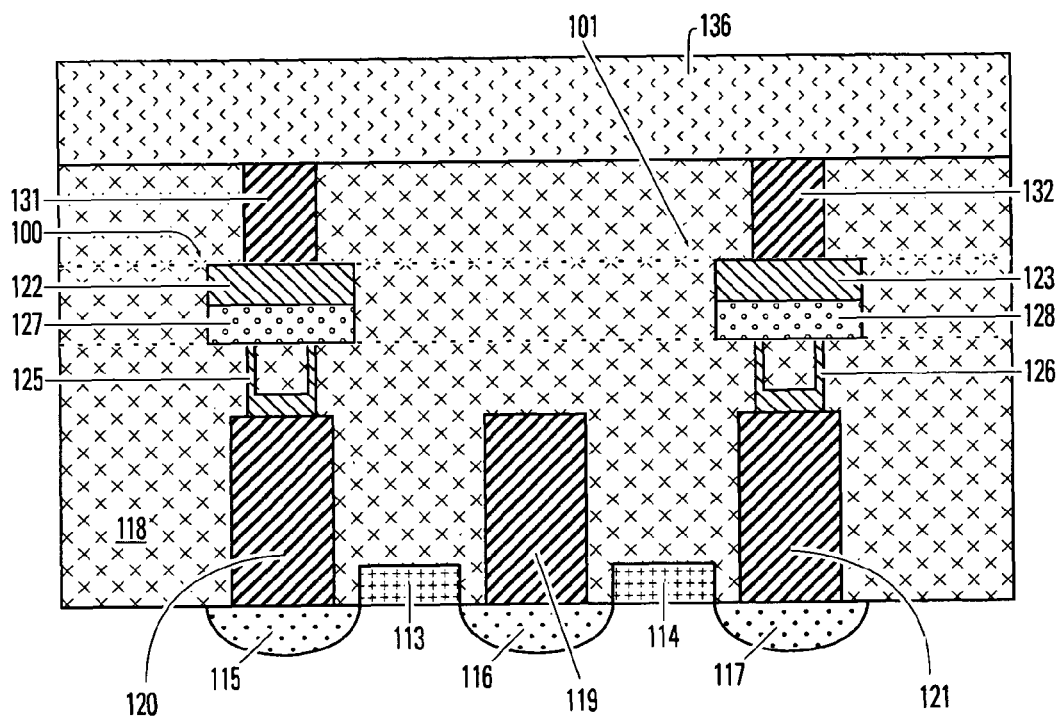
FIG. 5 is a cross-section of two cell array structure for an embodiment of the invention.

FIG. 5 depicts a cross-section of a pair of pipe-shaped electrode phase change random access memory cells 100-101. The cells 100-101 are formed on a semiconductor substrate. Isolation structures such as shallow trench isolation STI dielectric trenches (not shown) isolate pairs of rows of memory cell access transistors. The access transistors are formed by common source region 116 in the substrate, and drain regions 115 and 117 in the substrate. Polysilicon word lines 113 and 114 form the gates of the access transistors. The dielectric fill layer 118 is formed over the polysilicon word lines 113, 114. Contact plug structures 121 and 120 contact individual access transistor drains, and in the illustrated example, common source line 119 contacts source regions along a row in the array. In other embodiments, the common source line is implemented by a doped region in the substrate, such as an n+ doped region with optionally a silicide on the surface. The plug structure 120 acts as a terminal contacting the access transistor for the bottom electrode of cell 100. The plug structure 121 acts as a terminal contacting the access transistor for bottom electrode of cell 101. The cells 100 and 101 include pipe-shaped members 125, 126 respectively comprising an electrode material, such as TiN or another conductor selected for compatibility with the phase change material in elements 127, 128 of the cells. Phase change elements 127, 128 contact a ring-shaped top surface of the pipe-shaped members 125, 126. Top electrodes 122, 123 for the cells 100-101 contact the phase change elements 127, 128, and include material such as TiN or another conductor selected for compatibility with the phase change material in elements 127, 128. A patterned metal layer 136 formed using standard metallization technology comprising for example Cu or Al based metals, overlies and provides bit lines for the array of cells. Conductive plugs 131, 132 interconnect the patterned metal layer 136 and respective top electrodes 122, 123.

In representative embodiments, the plug structures comprises tungsten plugs, and the top and bottom electrodes comprise TiN. Other types of conductors can be used as well for these structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O.

Figure 6:
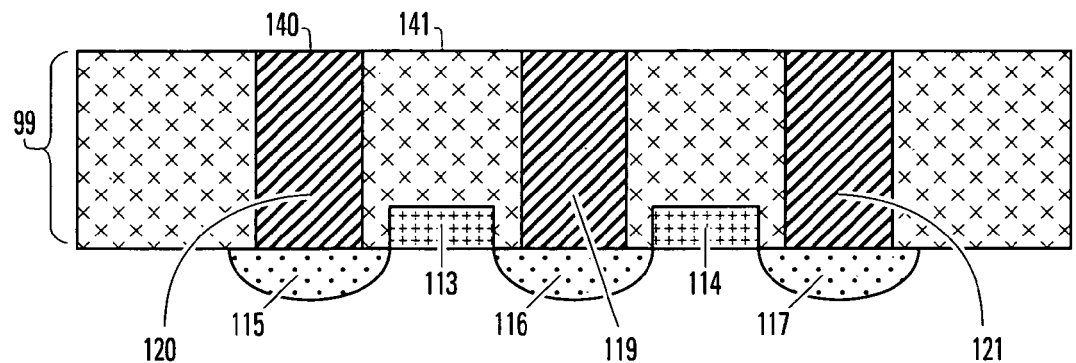
FIGS. 6-15 illustrate respective stages in a manufacturing process for a pipe-shaped, phase change memory element.

FIGS. 6-15 show stages of a manufacturing process for pipe-shaped electrode memory cells as shown in FIG. 5. FIG. 6 illustrates a structure 99 after front-end-of-line processing, forming the standard CMOS components in the illustrated embodiment corresponding to the word lines, and the access transistors in the array shown in FIG. 4. Plugs 120, 121 are included, formed in corresponding vias that extend through a fill layer 118, from the top surface 140 of the fill layer to the drain terminals (115, 117) of corresponding access transistors. The metal line 119 is formed in a trench in the fill layer 118 and extends along rows of access transistors between word lines 113 and 114. The metal line 119 and the plugs 120, 121 are formed using standard tungsten plug technology in an embodiment of the process, and have dimensions defined by the lithographic process used to pattern vias for the plugs. In FIG. 6, metal line 119 overlies doped region 116 in the semiconductor substrate, where the doped region 116 corresponds with the source terminal of a first access transistor on the left in the figure, and of a second access transistor on the right in the figure. Doped region 115 corresponds with the drain terminal of the first access transistor. A word line including polysilicon 113, and silicide cap (not shown), acts as the gate of the first access transistor. Fill layer 118 comprises a dielectric such as silicon dioxide and overlies the polysilicon word line 113. Plug 120 contacts doped region 115, and extends to the surface 140 of the structure 99. The drain terminal of the second access transistor is provided by doped region 117. A word line including polysilicon line 114, and the silicide cap (not shown) acts as the gate for the second access transistor. Plug 121 contacts doped region 117 and extends to the top surface 140 of the structure 99. Isolation trenches (not shown) separate the two-transistor structure including drain terminals 115 and 117, from adjacent two-transistor structures. The tops 140 of the plugs 120, 121 act as terminals for access to the access circuitry in the structure 99.

Figure 7:
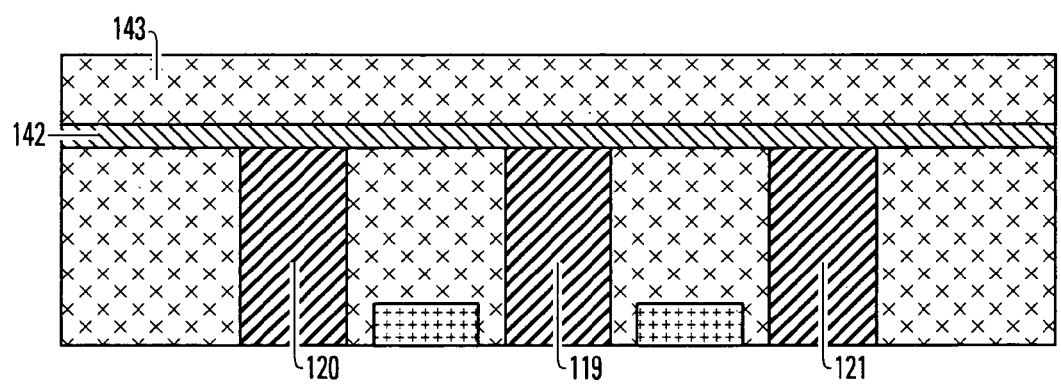

FIG. 7 shows a next stage in a manufacturing process. In this embodiment, a layer 142 of a first electrode material is deposited on the top surface 141 of the substrate 99. Optionally, the layer 142 is planarized by chemical mechanical polishing or otherwise to provide a uniform layer of electrode material over the array region on the integrated circuit. The finished layer 142 has a thickness for example in a range of 20 to 100 nanometers. The first electrode material may be Ti, Al, W, TiN, Cu, or other metals compatible with the process, selected for good adhesion to the top of the plugs, for adhesion to the second electrode material, and for stability.

Next, an insulating fill 143 which may comprise silicon dioxide or other dielectric or low thermal conductivity materials as described above, is deposited using chemical vapor deposition, plasma enhanced chemical vapor deposition, high-density plasma chemical vapor deposition and the like as known in the art. The thickness of the insulating fill 143 for example can be in the range of 100 to 200 nanometers.

Figure 8:
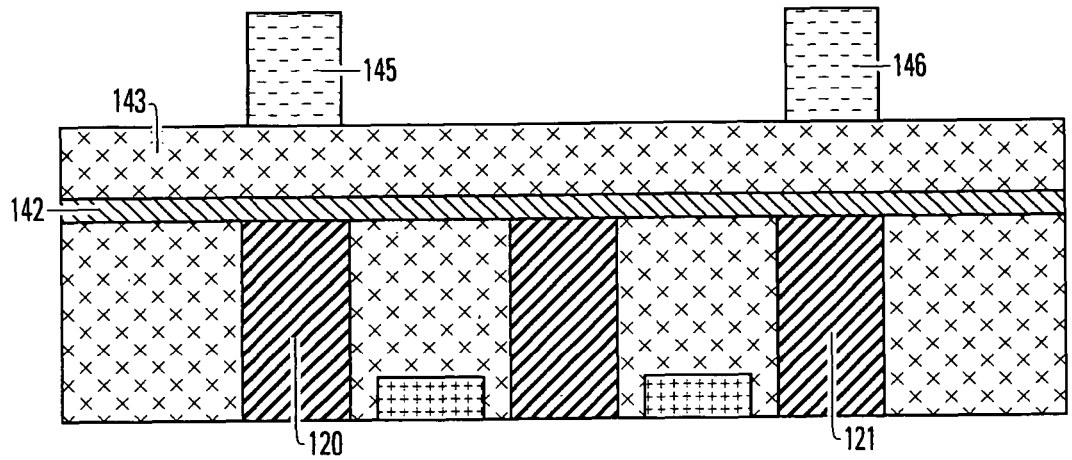

A next stage in the process as illustrated in FIG. 8, after a layer of photoresist is deposited and developed to form photoresist masks 145 and 146. The masks 145, 146 have an aerial view shape which is a circular, elliptical or square in embodiments of the invention, and are aligned with the plugs 120 and 121, within the tolerances of the photolithographic process.

Figure 9:
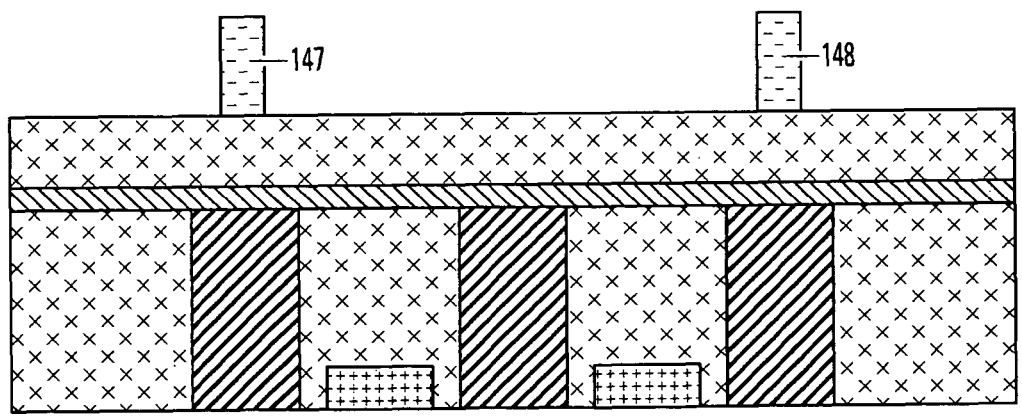

In a next stage in the process illustrated in FIG. 9, the photoresist masks 145 and 146 are trimmed to form smaller masks 147, 148. For example, the photoresist masks 145 and 146 can be etched using an oxygen plasma to form a sub-lithographic, smaller masks 147, 148 which preserve the aerial view shape of the masks 145, 146, with reduced diameter.

Figure 10:
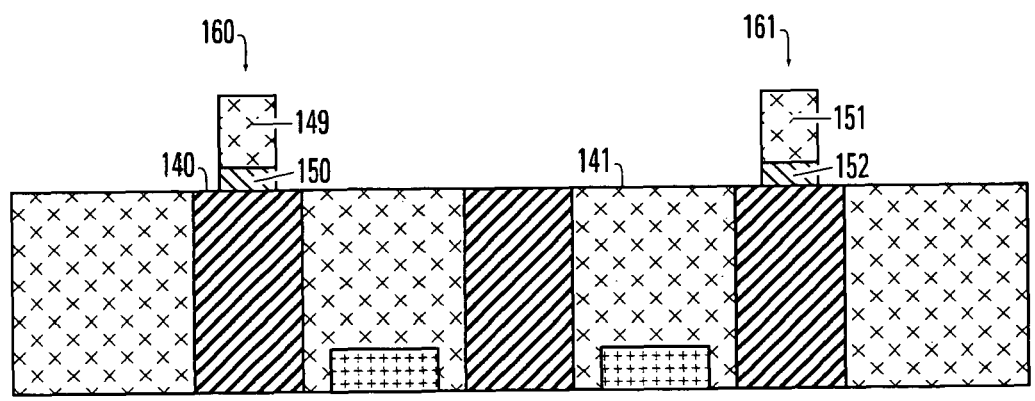

As shown in FIG. 10, in a next stage, the smaller masks 147, 148 are used as an etch mask to define pillar structures 160, 161, that include respective disc shaped members 150, 152 comprising material from the electrode layer 142 and respective pillar shaped members 149, 151 comprising material from the fill layer 143. In embodiments of the cell, the pillar shaped members 149, 151 have diameters of about 20 to 50 nanometers. The disc shaped members 150, 152 overlie the tops of 140 of the plugs 120, 121, and establish good electrical and physical contact with the plugs 120, 121.

Figure 11:
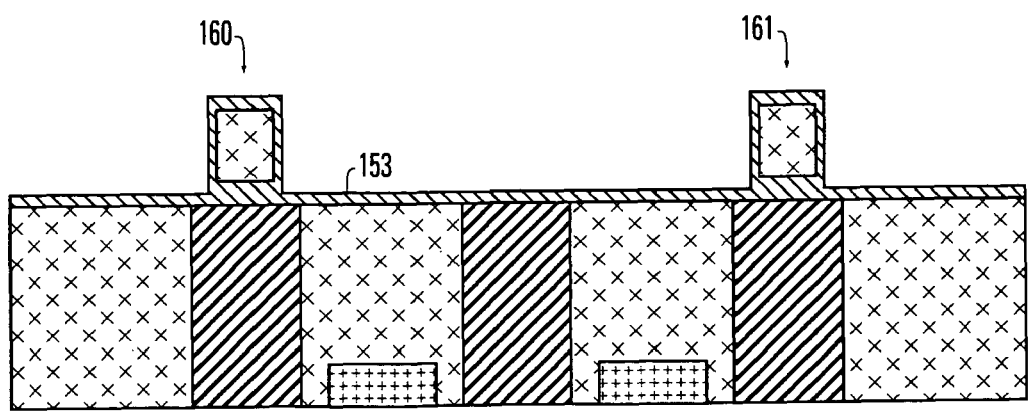

FIG. 11 illustrates a next stage in the process, after conformal deposition of a layer 153 of a second electrode material over the pillar structures 160, 161, and over the surface 141 of the substrate. In embodiments of the process, the second electrode material is the same as the first electrode material. In other embodiments, the second electrode material has higher resistivity than the first electrode material, and good adhesion characteristics to the programmable resistive material. For example, the second electrode material can be TaN, TiN, AlN, metal oxides such as iridium or lithium oxides, or combinations of materials. The second electrode material can be deposited using well-known technologies including chemical vapor deposition, sputtering, or other conformal deposition technologies suitable for the selected material.

Figure 12:
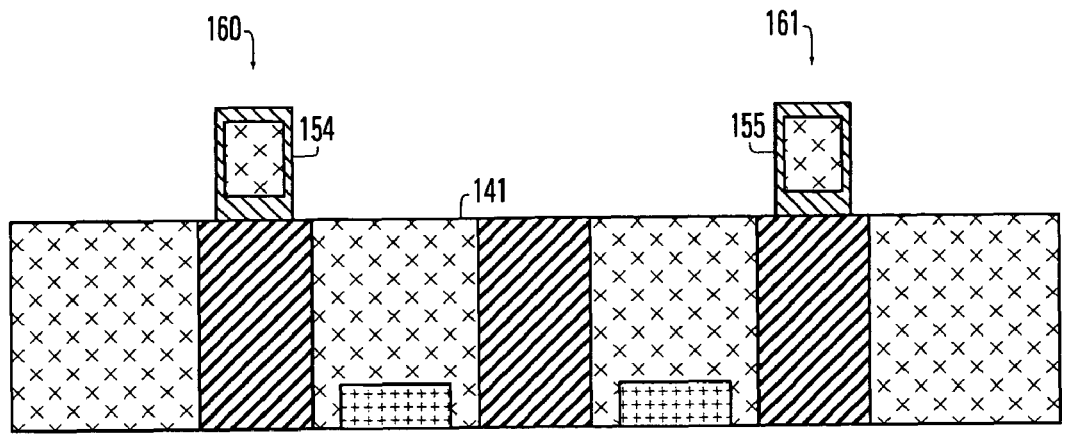

As shown in FIG. 12, a next processing step includes anisotropic etching of the layer 153 to form sidewall structures 154, 155 on the pillars 160, 161, while removing the electrode material from the surface 141 of the access layer 99.

Figure 13:
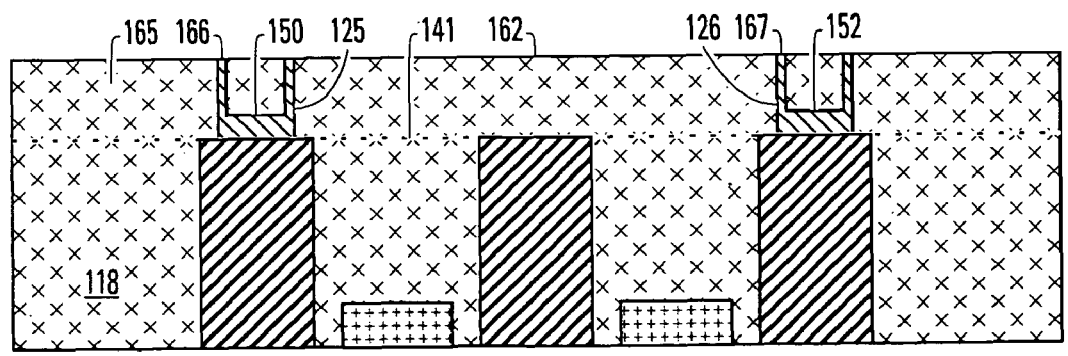

As illustrated in FIG. 13, in a next stage, a fill layer (remaining portions after etchback are labeled 165) is deposited followed by an etchback by chemical mechanical polishing, or otherwise, to level below the tops of the pillars 160, 161 to remove the electrode material from the top of the pillars 160, 161, and establish a height of the pipe-shaped members 125, 126. After the etchback, ring-shaped top surfaces 166, 167 of the pipe-shaped electrode members 125, 126 are exposed on a surface 162 of the resulting structure. The height of the pipe-shaped electrode members 125, 126 in a representative embodiment is about 80 to 150 nanometers, such as about 100 nanometers. The thickness of the sidewalls of the pipe-shaped electrode members 125, 126 is between about 10 and 30 nanometers, such as about 20 nanometers. The thickness of the disc shaped members 150, 152 can be therefore at least twice the thickness of the sidewalls on the pipe-shaped electrode members 156, 157 in preferred embodiments.

Figure 14:
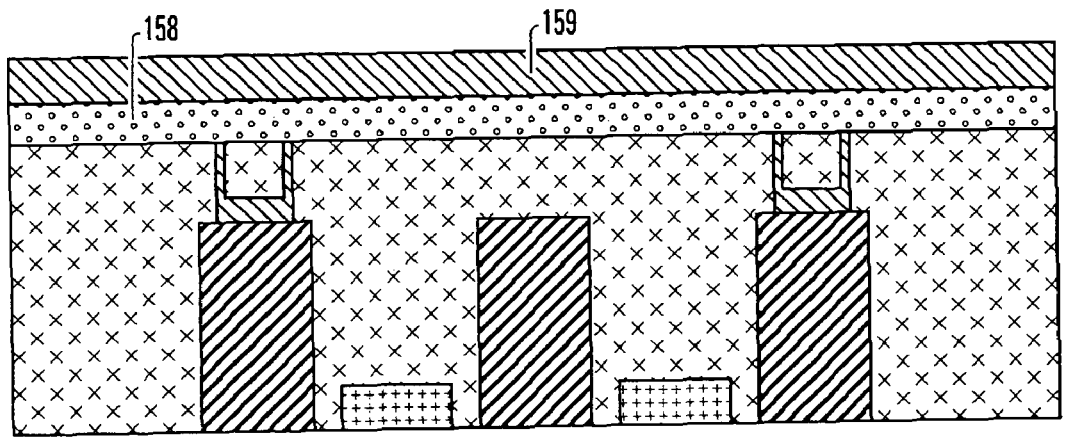

FIG. 14 illustrates a structure after depositing, by sputtering for example, a conformal layer 158 of GST, or other programmable resistive material, over the surface 162 of the fill layer 165. GST can be deposited using sputtering with collimation at about 250 degrees C. Alternatively, the GST can be deposited using a metal organic chemical vapor deposition (MO-CVD) process. In a representative embodiment, the conformal layer 158 comprises a thin film having a thickness of about 30 to 100 nanometers. Next, a layer 159 of electrode material, such as the same material used for layer 142, is deposited over the layer 158, having a thickness in the range of 30 to 100 nanometers.

Figure 15:
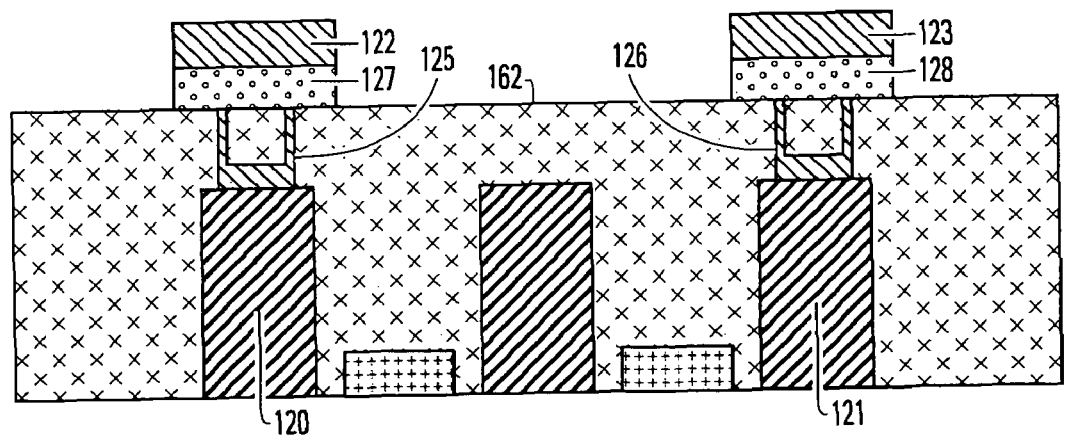

FIG. 15 shows a next stage, after lithographically patterning the layers 158, 159 to define memory elements 127, 128 on the pipe-shaped electrode members 125, 126.

A next stage is illustrated in FIG. 5 described above, after an insulating fill is deposited over the structure shown in FIG. 15. In possible embodiments, the fill is completed using a higher temperature process such as plasma enhanced chemical vapor deposition PECVD or high-density plasma HDP CVD of silicon dioxide or other similar material. Finally, metallization is applied to define bit lines 136 and interlayer contacts 131, 132 for example as shown in FIG. 5.

In operation, current flows on a path including a terminal in an access device in contact with the plug 120, the sides of the pipe-shaped member 125 and the ring-shaped surface where it contacts the programmable resistive memory element 127. The current path further includes the top electrode member 122, the plug 131 and the metal line 136. The active regions, generally in the locations within the programmable resistive memory elements near the ring-shaped surfaces of the pipe-shaped members, in which the phase change occurs due to heat caused by the current flow, are very small, reducing the magnitude of current needed for reset. Furthermore, because of the geometry of the ring-shaped surface, variations in diameters of the pipe-shaped members, and in thicknesses of the sidewalls on the pipe-shaped members have relatively little effect on the cell operational characteristics, allowing for more uniform distributions of cell characteristics across a large array than is available with other structures In embodiments described, the pipe-shaped member has sides that are continuous around the perimeter of the cell. In alternatives, deposition techniques could be used to make the pipe-shaped member discontinuous around the sides, further reducing the volume the active regions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for manufacturing a memory device, comprising:

forming a first electrode comprising a pipe-shaped member having an axis, a first end, a second end and sidewalls having thickness in a dimension orthogonal to the axis of the pipe-shaped member, having a ring-shaped surface at the second end, and a disc shaped member coupled to the first end of the pipe-shaped member, including
    forming a first layer of electrode material;

forming a pillar on the first layer of electrode material, the pillar having a cylindrical outside surface;

depositing a conformal layer of electrode material over the cylindrical outside surface of the pillar and over the first layer of electrode material to form an electrode material covered pillar; and removing electrode material from on top of the electrode material covered pillar to expose a top surface of the pillar and a ring-shaped top surface of the conformal layer of electrode material to form said pipe-shaped member and removing electrode material of the first layer to form said disc shaped member;

forming a layer of programmable resistive material in contact with the ring-shaped top surface of the pipe-shaped member; and forming a second electrode in contact with the layer of programmable resistive material.

2. The method of claim 1, wherein the first layer of electrode material comprises a first material, and the conformal layer of electrode material comprises a second material that is different than the first material.

3. The method of claim 1, wherein the pillar comprises a thermal insulator inside the pipe-shaped member.

4. The method of claim 3, wherein the programmable resistive material has an amorphous state, and the thermal insulator inside the pipe-shaped member having a thermal conductivity less than the programmable resistive material in the amorphous state.

5. The method of claim 1, wherein the pipe-shaped member has a cylindrical inside surface and an outside surface, having a thickness between the inside surface and the outside surface less than 30 nm.

6. The method of claim 1, wherein the pipe-shaped member has length along its axis of less than 150 nm.

7. The method of claim 1, wherein the pipe-shaped member has a cylindrical inside surface having a diameter less than 50 nm.

8. The method of claim 1, wherein the pipe-shaped member has a cylindrical inside surface and an outside surface, having a thickness between the inside surface and the outside surface, and wherein the thickness of the disc shaped member is greater than twice the thickness of the sidewalls between the inside surface and the outside surface.

9. The method of claim 1, wherein the programmable resistive material comprises a chalcogenide.

10. The method of claim 1, wherein the programmable resistive material has at least two solid phases which are reversibly inducible by a current.

11. The method of claim 1, wherein the programmable resistive material has at least two solid phases which include a generally amorphous phase and a generally crystalline phase.

12. The method of claim 1, wherein the programmable resistive material comprises $Ge_2Sb_2Te_5$.

13. The method of claim 1, wherein said disc shaped member comprises a first material, and said pipe-shaped member comprises a second material that has a higher resistivity than the first material.

14. A method for making a memory device comprising:
forming a memory cell access layer on a substrate, the memory cell access layer including an interlayer dielectric having an upper surface and contacts exposed on the upper surface;

depositing a first electrode layer on the upper surface contacting said contacts;

forming a pillar on the first electrode layer, the pillar having a cylindrical outside surface;

depositing a conformal layer of electrode material over the cylindrical outside surface of the pillar and over first electrode layer to form sidewalls of electrode material on the pillar leaving an electrode material covered pillar;

removing electrode material from on top of the electrode material covered pillar to expose a top surface of the pillar and a ring-shaped top surface of the conformal layer of electrode material, to form a pipe-shaped member comprising at least a portion of the sidewalls of electrode material, and removing exposed portions of the first electrode layer to form a disc shaped member coupled to the pipe-shaped member;

forming a layer of phase change material in contact with the top surface of the pipe-shaped member;

forming a layer of top electrode material in contact with the layer of phase change material; and etching the layer of top electrode material and the layer of phase change material to define memory cell stacks contacting respective contacts on said upper surface of the memory cell access layer.

15. The method of claim 14, wherein the pillar comprises a thermal insulator inside the pipe-shaped member.

16. The method of claim 15, wherein the phase change material has an amorphous state, and the thermal insulator inside the pipe-shaped member has a thermal conductivity less than the phase change material in the amorphous state.

17. The method of claim 14, wherein the pipe-shaped member has a cylindrical inside surface and an outside surface, having a thickness between the inside surface and the outside surface less than 30 nm.

18. The method of claim 14, wherein the pipe-shaped member has a cylindrical inside surface having a diameter less than 50 nm.

19. The method of claim 14, wherein the pipe-shaped member has a cylindrical inside surface and an outside surface, having a thickness between the inside surface and the outside surface, and wherein the thickness of the disc shaped member is greater than twice the thickness of the sidewalls between the inside surface and the outside surface.

20. The method of claim 14, wherein the phase change material comprises a chalcogenide.

21. The method of claim 14, wherein the phase change material comprises $Ge_2Sb_2Te_5$.

22. The method of claim 14, wherein the pipe-shaped member has length along its axis of less than 150 nm.

* * * * *